(12) United States Patent
Ryan et al.

(10) Patent No.: US 6,643,194 B2
(45) Date of Patent: Nov. 4, 2003

(54) WRITE DATA MASKING FOR HIGHER SPEED DRAMS

(75) Inventors: Kevin J. Ryan, Eagle, ID (US); Christopher K. Morzano, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/222,842

(22) Filed: Aug. 19, 2002

(65) Prior Publication Data

US 2002/0196700 A1 Dec. 26, 2002

Related U.S. Application Data

(62) Division of application No. 09/883,957, filed on Jun. 20, 2001.

(51) Int. Cl.[7] .................................................. G11C 7/00
(52) U.S. Cl. ................... 365/195; 365/120; 365/230.06
(58) Field of Search ............................ 365/120, 189.01, 365/195, 230.06, 233, 238.5

(56) References Cited

U.S. PATENT DOCUMENTS

| | | |
|---|---|---|
| 4,807,189 A | 2/1989 | Pinkham et al. |
| 5,148,396 A | 9/1992 | Nakada |
| 5,167,029 A | 11/1992 | Eikill et al. |
| 5,285,414 A | 2/1994 | Yamauchi et al. |
| 5,539,696 A | 7/1996 | Patel |
| 5,680,361 A | 10/1997 | Ware et al. |
| 5,781,493 A * | 7/1998 | Kobayashi ............. 365/230.03 |
| 5,838,832 A | 11/1998 | Barnsley |
| 5,841,730 A | 11/1998 | Kai et al. |
| 5,907,519 A | 5/1999 | Ryu et al. |
| 5,983,314 A | 11/1999 | Merritt |
| 6,034,916 A | 3/2000 | Lee |
| 6,192,446 B1 * | 2/2001 | Mullarkey et al. .......... 711/105 |

* cited by examiner

Primary Examiner—Vanthu Nguyen
(74) Attorney, Agent, or Firm—Dickstein Shapiro Morin & Oshinsky LLP

(57) ABSTRACT

A method and apparatus for masking data written to a memory device that reduces the effective write cycle time of the memory device is disclosed. Firing of the column selects is pre-empted, thereby masking data to be written to a memory device. By pre-empting the column selects, the margin required for disabling a write driver can be eliminated, thereby reducing the effective write cycle. Additionally, data masking can be performed on a per-byte basis by associating independent column selects with each data byte on multi-byte wide devices, e.g., x16 or x32.

3 Claims, 9 Drawing Sheets

| FIG. 1A | FIG. 1B |

PRIOR ART

| FIG. 1A | FIG. 1B |

PRIOR ART

| FIG. 3A | FIG. 3B |

| FIG. 3A | FIG. 3B |

WRITE DATA MASKING FOR HIGHER SPEED DRAMS

This application is a divisional of application Ser. No. 09/883,957, filed Jun. 20, 2001, the subject matter of which is incorporated by reference herein.

BACKGROUND OF THE INVENTION

1. Field of the Invention

The present invention relates to semiconductor memory devices and, more particularly, to data masking circuits and data masking methods for semiconductor memory devices.

2. Description of the Related Art

Electronic equipment and electronic-based systems require some form of high-speed memory devices for storing and retrieving information. While the type of such memory devices vary, semiconductor memory devices are most commonly used in memory applications requiring implementation in relatively small areas. Within this class of semiconductor memory devices, random access memory (RAM) is one of the common types. A RAM incorporates an array of individual memory cells. A user may execute both read and write operations on the memory cells of a RAM. A typical example of a RAM is a dynamic random access memory (DRAM), as is well known in the art.

To allow a DRAM to operate at high speed, "synchronous" DRAMS, also referred to a SDRAMs, have been developed. A synchronous DRAM can receive a system clock that is synchronous with the processing speed of the overall system. The internal circuitry of the SDRAM can be operated in such a manner as to accomplish read/write operations in synchronism with the system clock.

SDRAMs include Single Data Rate (SDR) SDRAMs and Double Data Rate (DDR) SDRAMs. In a SDR SDRAM, data can be input and output at either only the rising edge or only the falling edge of a clock signal. In a DDR SDRAM, data can be input and output at both the rising and falling edges of the clock signal. Therefore, the DDR SDRAM can have a data bandwidth which is twice the clock frequency.

It is also known to use a data input/output mask signal applied externally to the memory device to mask output data from the memory device during a read operation and to mask input data to the memory device during a write operation. For example, situations occur when it is desired to send a data stream to a memory device, but it is also desired that some of the data stored in the memory device remain the same. A data mask can be used to block some of the data in the data stream from reaching the individual memory cells that should remain undisturbed.

FIG. 1 illustrates in block diagram form a portion of a conventional memory device 20 in which data write masking is used. The memory depicted illustrates a single bank (BANK0) of a 64 Meg SDRAM. BANK0 memory array 22 includes memory cells arranged in rows and columns for storing data. Command decoder 24, included in control logic 26, receives control signals from a command bus CMD to place control logic 26 in a particular operation sequence. Control logic 26 controls the various circuitry of SDRAM 20 based on decoded commands such as reads or writes from or to memory bank 22. A specific address for which a read or write command is to occur is provided to address register 28, which provides the address to row-address multiplexer 30 and column-address counter 32. Row address multiplexer 30 provides a row address to row decoder 34, which decodes the row address and activates one of the lines corresponding to the row address in BANK0 22 for a read or write transfer operation. Column address counter 32 provides a column address to column decoder 36, which activates the I/O gating 38 of the column corresponding to the column address. Data being written to the memory 20 is input on data lines (DQ) via the input/output datapath logic circuit 40, driven by write drivers 42 and passed to the I/O gates 38 for writing to the array 22. During a read operation, data from the array 22 is passed through the I/O gates 38 to read latch 44 to datapath logic circuit 40 and output on the data lines (DQ).

Conventional data masking during a write operation is accomplished by sending a mask control signal (DM) through the datapath logic circuit 40 to the write drivers 42 at the same time the data stream is being routed through the write drivers 42. This mask control signal causes the write driver 42 to go "tri-state" or high impedance, blocking the data stream's path to the I/O gates 38. As illustrated in FIG. 1, each write driver 42 drives 8 bits of data (D0–D7, D8–D15, D16–D23, D24–D32, respectively) for a total of 32 bits or 4 bytes. Four data mask signals are provided (DM0, DM1, DM2, DM3), one for each group of 8 bits or byte.

FIGS. 2A and 2B are timing diagrams of various signals generated in the memory device 20 during a write operation with data masking. In order to save space, in FIGS. 2A, 2B, 4A, and 4B, the data lines (DQ0–DQ31) are not individually shown. Instead, each group of data lines corresponding to each byte of data are shown. Thus, XB0 represents the group of data lines corresponding to the first byte of data (DQ0–DQ7), XB1 represents the data lines corresponding to the second byte of data (DQ8–DQ15), XB2 represents the data lines corresponding to the third byte of data (DQ16–DQ23), and XB3 represents the data lines corresponding to the fourth byte of data (DQ24–DQ31). Additionally, several signals are prefixed with "X", "Y", or "Z". These prefixes indicate different points in time, wherein X designates the time at which a memory device is presented with the write command, Y designates the time after the write command and the associated memory address has been decoded, but before the time when the data is written to the memory arrays of the memory device, while Z indicates the time when the memory arrays are written. Thus, the timing diagrams of FIGS. 2A, 2B, 4A, and 4B, permit the reader to follow the relationship between the data signals and data mask signals relative to other signals in the memory device as the data travels through the memory device.

In FIG. 2A, the illustrated memory device 20 is a 32-bit wide (x32) memory undergoing 16-byte write of data bytes B0–B15. Since the memory device is 32-bit or 4-bytes wide, the memory device accepts 4-bytes per clock cycle for writing on data byte lines XB0–XB3. In order for the memory device to support per-byte data masking, the memory device must support one data mask line (XDM0–XDM3) per data byte line (XB0–XB3). At a first clock cycle of the clock CLK, the WRITE command is present on the command bus CMD. Not illustrated, but also present is the address associated with the first data byte B0. Present shortly after the write command are the data (B0–B15) to be written as well as an associated data mask on data mask lines XDM0–XDM1.

Referring now to FIG. 2B, it can be seen that data on signal lines YB0–YB3 and the data mask on data mask signal lines YDM0–YDM3 have been delayed by an identical amount due to the need for the command decoder 24 to decode the write command and the column decoder 36 and row address decoder 34 to decode the address. At this point data is present on the data lines YB0–YB3 can be driven by the write drivers 42 to the I/O gates 38 if the write driver enable lines WD0–WD3 are high. As shown, data which is to be written, for example data B0–B5, B8–B10, and B12–B15, are accompanied by a high write driver enable signal to permit the data to be driven to the I/O gates 38 while the column select signal ZCS0–ZCS3 associated with those bytes are also driven high to activate the proper column in the memory array, thereby permitting the data to be written to the array 22. On the other hand, when data needs to be masked from writing, for example data B6, B7, and B11, the data mask signal YDM0–YDM3 is high, causing the write driver signal WD0–WD3 to go low, thereby preventing masked data from being driven to the I/O gates 38 and written to the array 22.

As illustrated in FIG. 2B, the column select lines ZCS8–ZCS3 are fired each time regardless of whether data is to be masked nor not. Between each successive firing of the column selects, there is a time period x at which the column select is off. This time period x is provided to give a margin for the mask to turn on, i.e., to disable the write driver. Additionally, the data lags the firing of the column selects by a period of time y. Thus, the effective cycle time for each write operation to occur can be calculated as follows:

$$\text{Effective write cycle} = \text{Minimum write time} + x + y \quad (1)$$

The data masking operation described above effectively masks data being written to a DRAM. As processor frequencies have increased, however, additional speed is being demanded of memory. The data masking operation described above is an impediment to faster write operations in ways that affect transparency of the DRAM. For example, the masking operation is an additional operation that must be accomplished by the DRAM. The time required to perform data writes utilizing the data masking as described above limits the speed at which the writes can be performed to the effective cycle time as calculated by Equation 1. This necessarily limits that speed at which the memory device can operate, and thus the speed at which the overall system in which the memory device is located can operate. It is therefore desirous to provide a memory device with a decreased effective cycle time for performing write operations to allow operation at faster speeds.

SUMMARY OF THE INVENTION

The present invention alleviates the problems associated with the prior art and provides a method and apparatus for masking data written to a memory device that reduces the effective write cycle time of the memory device. In accordance with the present invention, firing of the column selects is pre-empted, thereby masking data to be written to a memory device. By pre-empting the column selects, the margin required for disabling a write driver can be eliminated, thereby reducing the effective write cycle. Additionally, data masking can be performed on a per-byte basis by associating independent column selects with each data byte on multi-byte wide devices, e.g. x16 or x32. These and other advantages and features of the invention will become more readily apparent from the following detailed description of the invention which is provided in connection with the accompanying drawings.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figures 3, 3A:
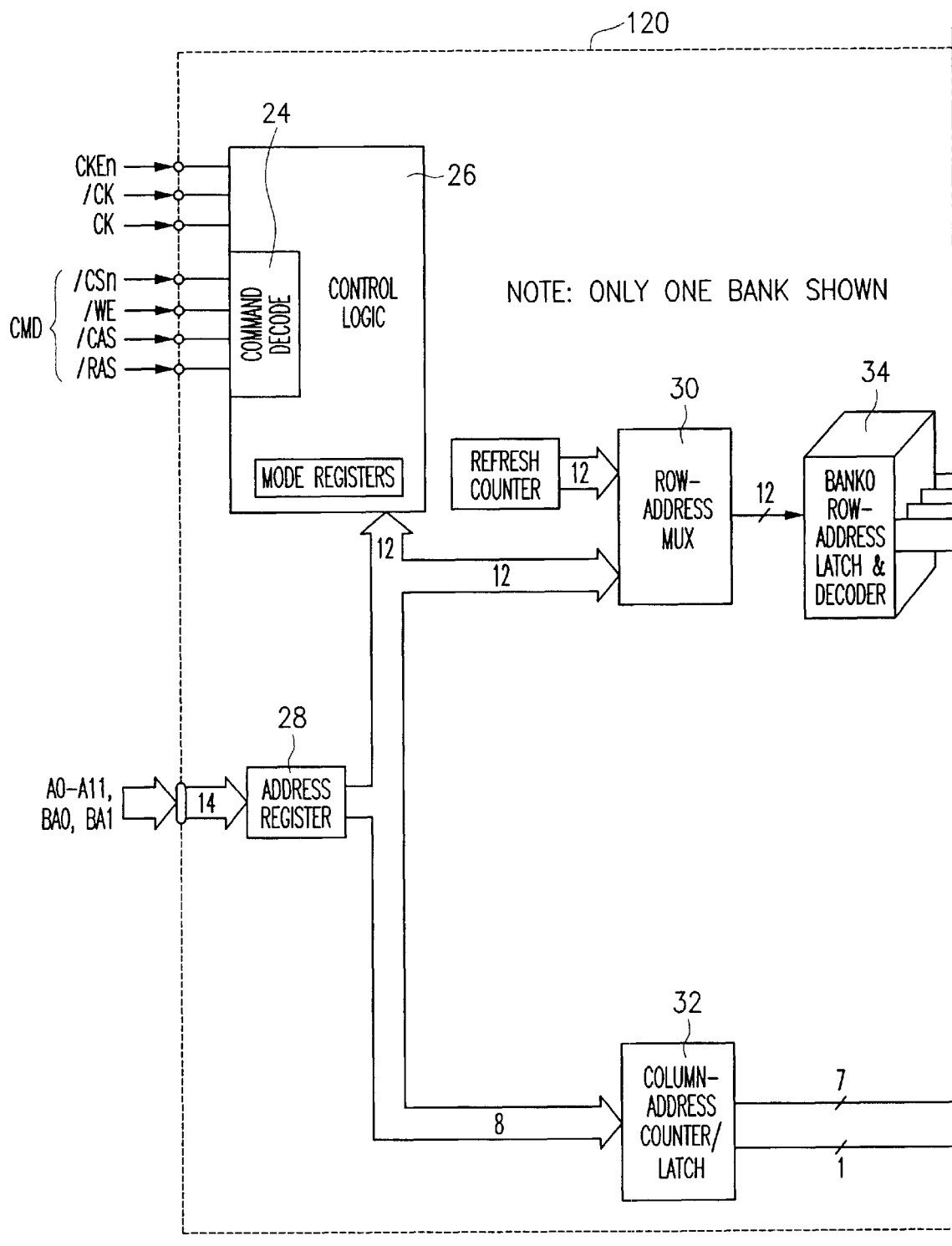
FIG. 3 is a block diagram of a portion of a memory device having data masking according to the present invention.
Figures 3, 3B:
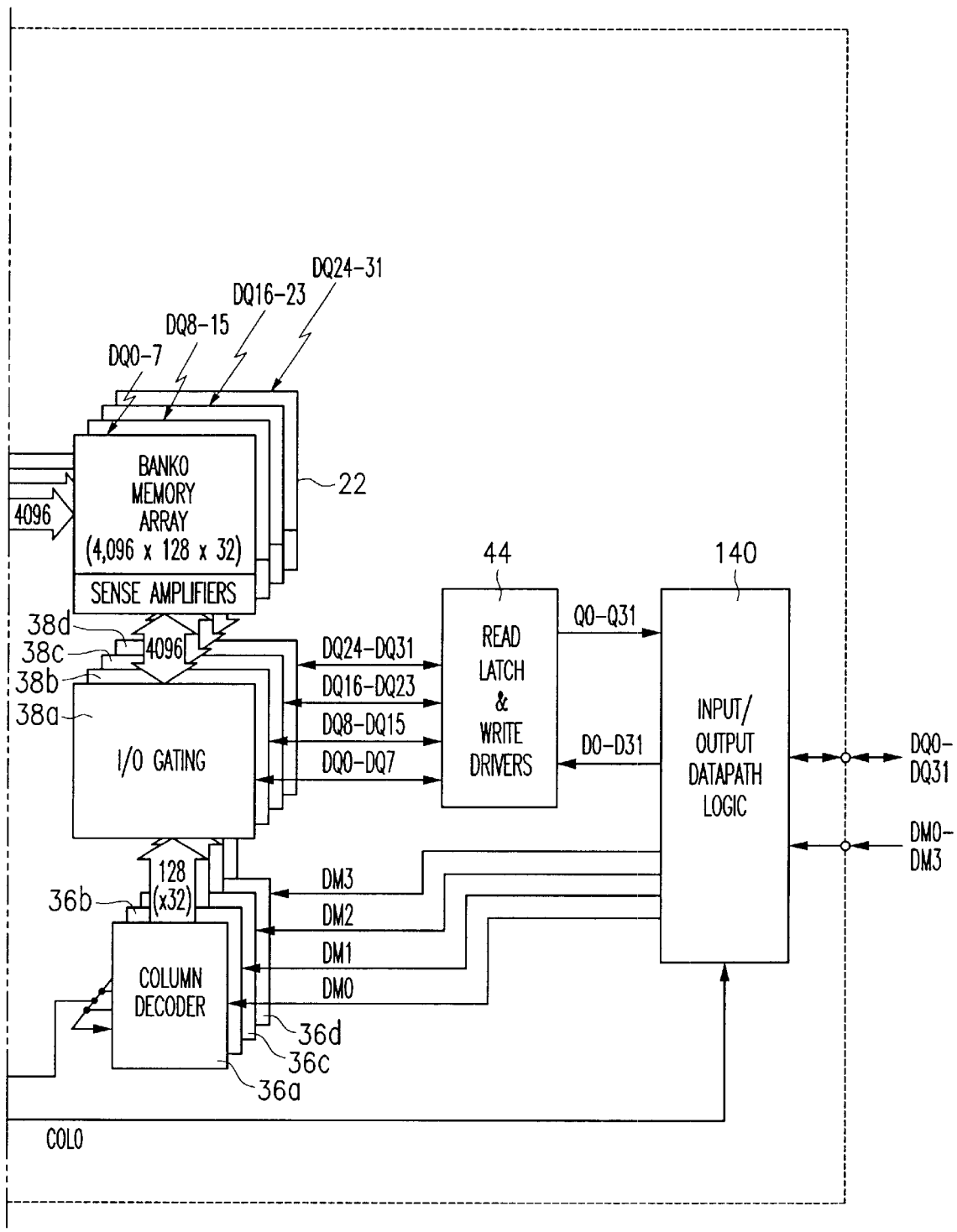

The present invention will be described as set forth in the exemplary embodiments illustrated in FIGS. 3–5. Other embodiments may be utilized and structural or logical changes may be made without departing from the spirit or scope of the present invention. Like items are referred to by like reference numerals.

In accordance with the present invention, firing of the column selects is pre-empted to mask data to be written to a memory device, thereby reducing the effective cycle time and allowing operation at faster speeds. FIG. 3 illustrates in block diagram form a portion of a memory device 120 having data masking according to the present invention. FIG. 3 is similar to FIG. 1 except as noted below, and the description of like items will not be repeated here.

Data masking during a write operation according to the present invention is accomplished by sending a mask control signal (DM0–DM3) through the datapath logic circuit 140 to an associated column decoder 36a–36d. The column decoder 36a–36d receiving an active data mask signal DM8–DM3 will be pre-empted from firing its column select, thus preventing the data stream from passing from the I/O gating 38a–38d to the memory array 22.

Figure 4A:
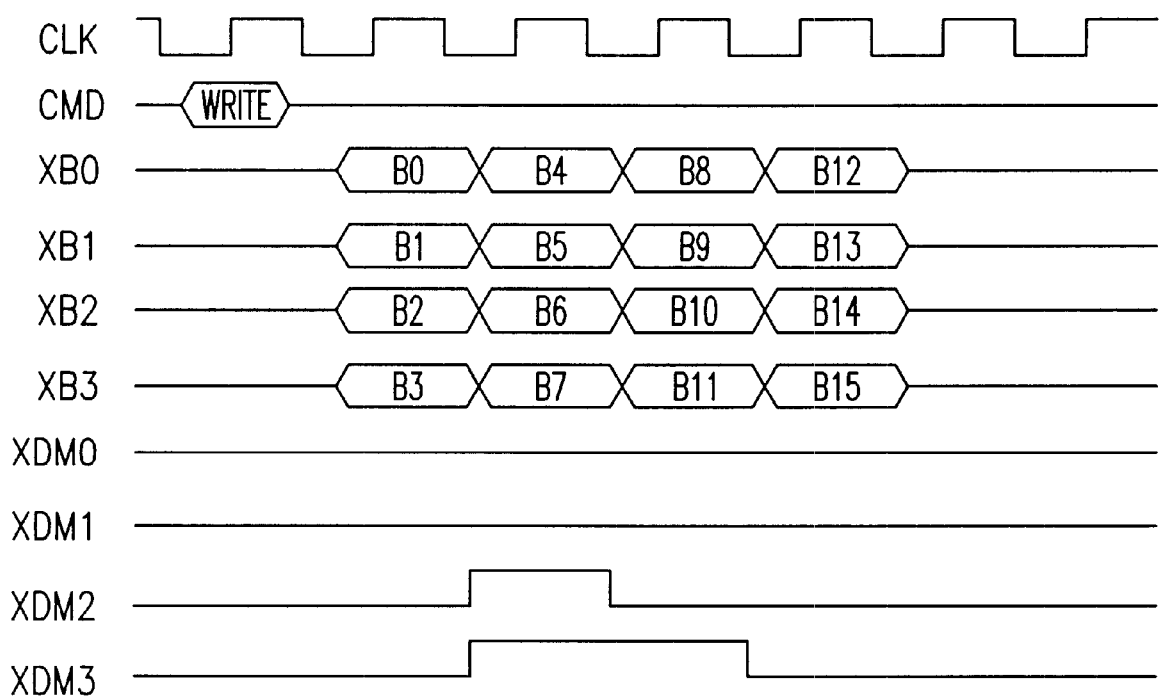
FIGS. 4A and 4B are timing diagrams of various signals generated in the memory device of FIG. 3 during a write operation with data masking according to the present invention.
Figure 4B:
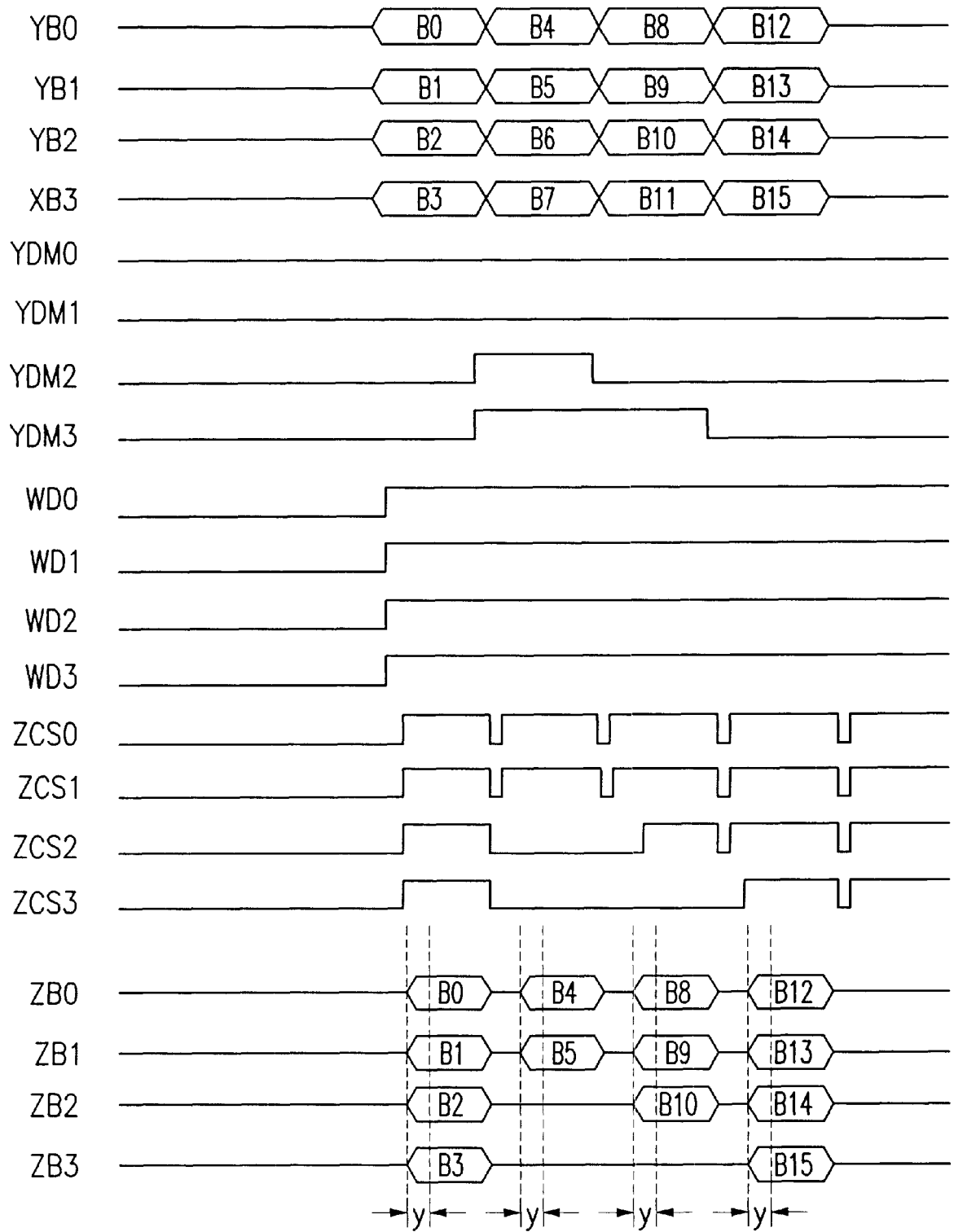

FIGS. 4A and 4B are timing diagrams of various signals within the memory device 120 of the present invention. As before, the illustrated memory device 120 is a 32-bit wide (x32) memory undergoing a 16-byte write of data bytes B0–B15. Since the memory device is 32-bit or 4-bytes wide, the memory device accepts 4-bytes per clock cycle for writing on data byes lines XB0–XB3. In order to support per-byte data masking, the memory device must support one data mask line per byte width. Thus, the illustrated memory device includes 4 data mask lines XDM0–XDM3.

On a first clock cycle of the clock signal CLK, a write command is presented on command bus CMD, along with an associated address for data B0 (not illustrated). On the following clock cycle, data to be written (e.g., B0–B3) to the memory device 120 appears on data lines XB0–XB3 and the write mask for that data appears on data mask lines XDM0–XDM3. On each of the following 3 clock cycles additional data and data masks are presented on the data lines XB0–XB3 and data mask lines XDM0–XDM3.

The data B0–B15 and the data mask signals are accepted by the memory device 120 and are routed within the memory device. The data makes its way through the write drivers 44 and are driven to the I/O gates 38, as shown on signal lines YB0–YB3. The data mask signals are routed within the memory device 120 to the column decoders 36a–36d, as represented by signal lines YDM0–YDM3. There is one data mask signal per column decoder, and each column decoder is associated with generating the column select signal for one byte of data.

Each column decoder 36a–36d decodes the address associated with the data in order to generate a column select signal. The addresses presented to the column decoders are preferably delayed so as to arrive coincident with the data mask signals YDM0–YDM3. The column decoders 36a–36d also examine the state of the data masking signals YDM0–YDM3. Each column decoder 36a–36d asserts its column select signal ZCS8–ZCS3 only if its associated data masking signal YDM0–YDM3 is not asserted. If a column select signal ZCS8–ZCS3 is asserted, the selected column is turned on thereby permitting data to be written into that column. If a column select signal ZCS0–ZCS3 is not asserted, the data cannot be written to that column, thereby masking the data from being written.

Thus, as illustrated in FIG. 4B, column select lines are associated with different bytes of the data stream and are fired only for data bytes which are not being masked. Accordingly, since the column selects fire only if a data byte is not being masked, there is no need for any delay between the firing of the column selects to give a margin for the mask to turn on, i.e., to disable the write driver, as in the conventional memory devices. The effective cycle time for each write operation according to the present invention can be calculated as follows:

$$\text{Effective write cycle} = \text{Minimum write time} + y \qquad (2)$$

where y is the time period the data lags the firing of the column select to provide a margin to ensure the next data stream will not write to a previous column. Thus, the effective write cycle time according to the present invention (Equation 2) is reduced by the value of x (from Equation 1) as compared to conventional memory devices, thereby allowing operation at faster speeds.

In addition, the data masking according to the present invention can be provided as a user selectable option. For example, a Data Mask Enable bit can be provided in a mode register. When the Data Mask Enable bit is set to a "1," data masking is operational, requiring increased timing parameters for the data masking to occur. When set to a "0," data masking is disabled, thus allowing decreased timing parameters for the memory device to be used.

Figures 1, 1A:
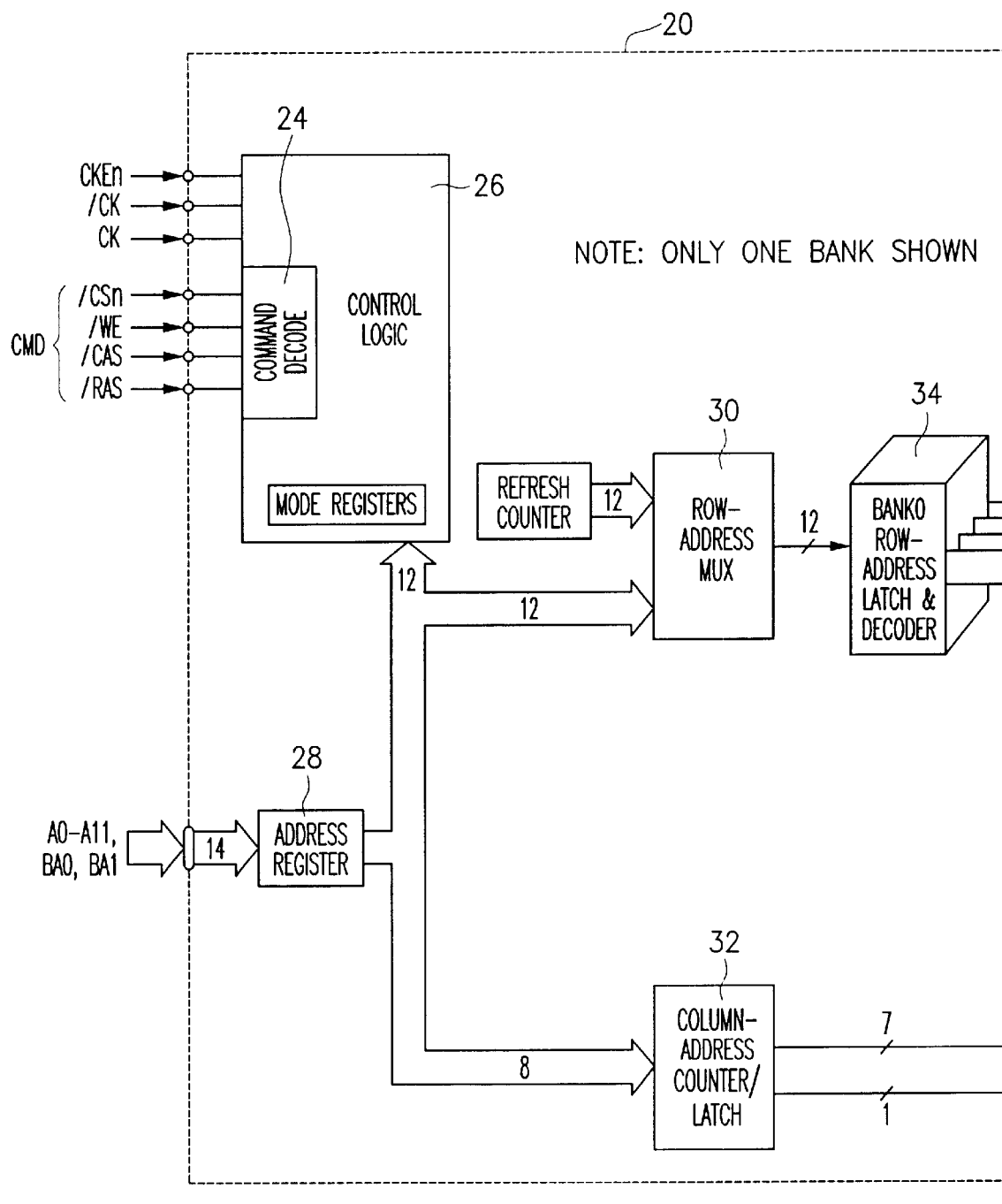
FIG. 1 is a block diagram of a portion of a conventional memory device.
Figures 1, 1B:
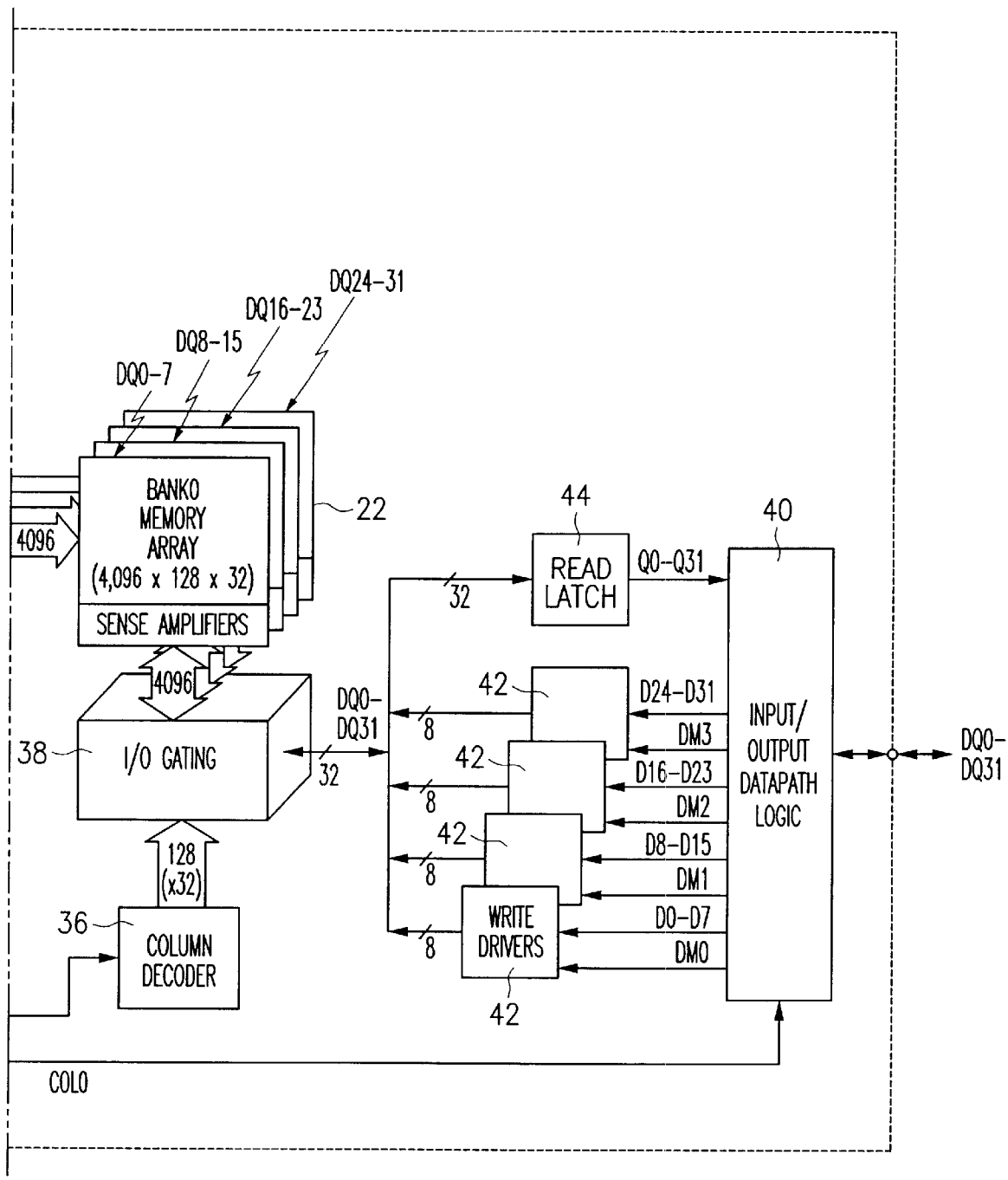
Figure 2A:
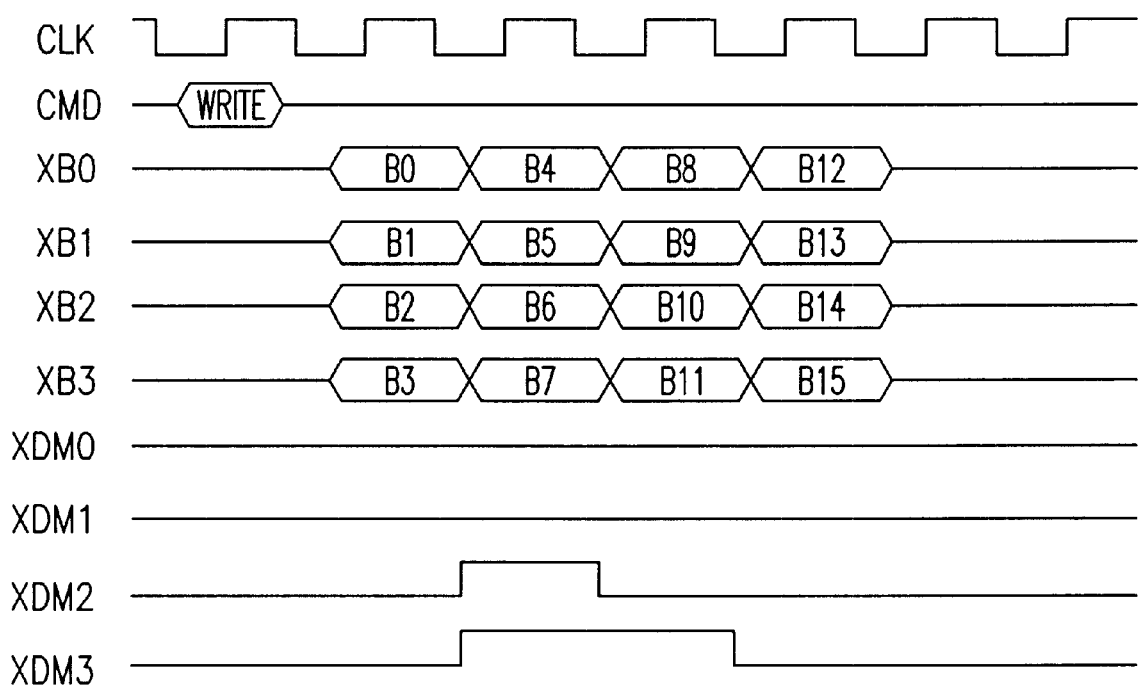
FIGS. 2A and 2B are timing diagrams of various signals generated in the memory device of FIG. 1 during a write operation with data masking.
Figure 2B:
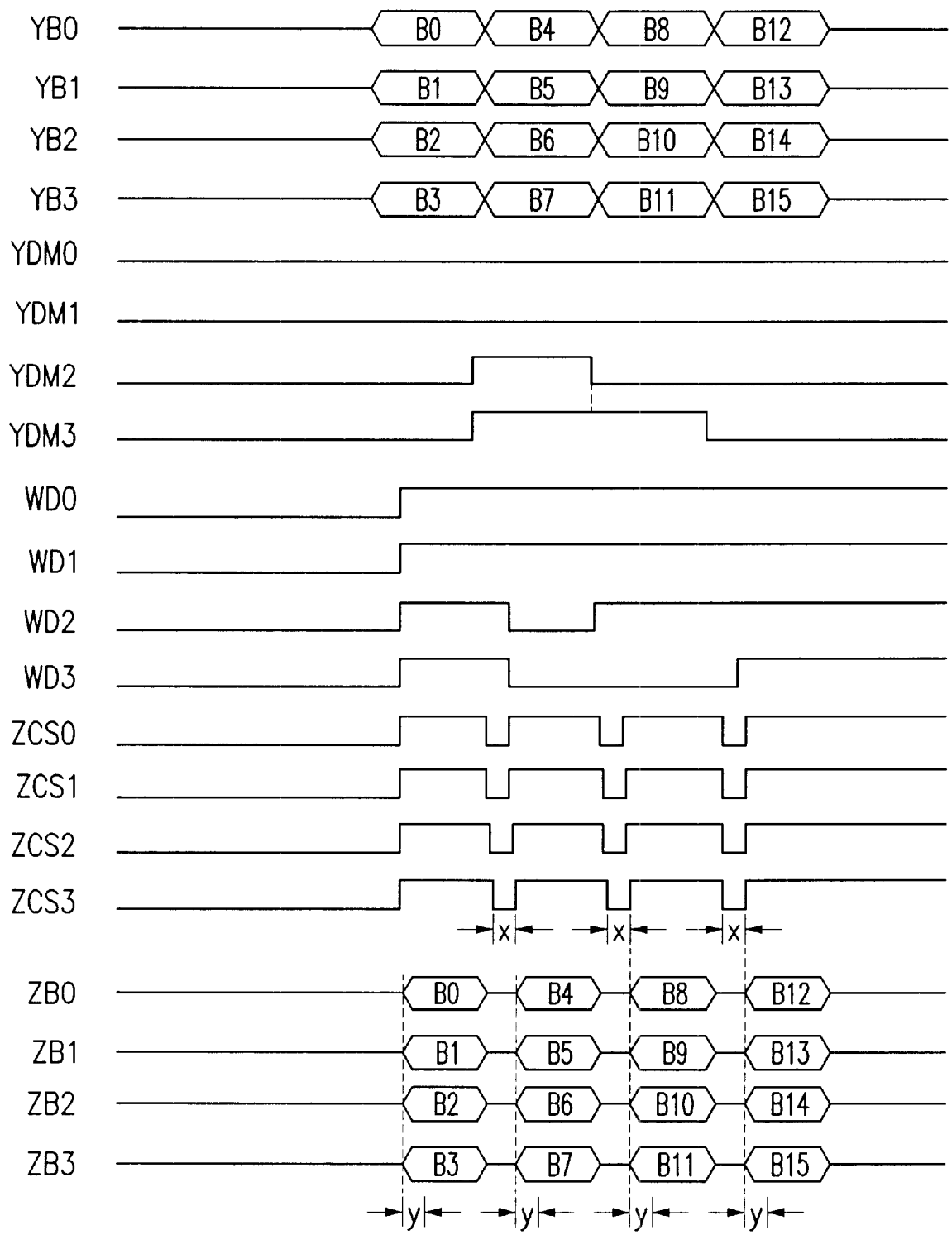

It should be noted that pre-empting of the firing of the column selects according to the present invention can be done in addition to or instead of pre-empting the firing of the write drivers as described with respect to FIGS. 1 and 2.

Figure 5:
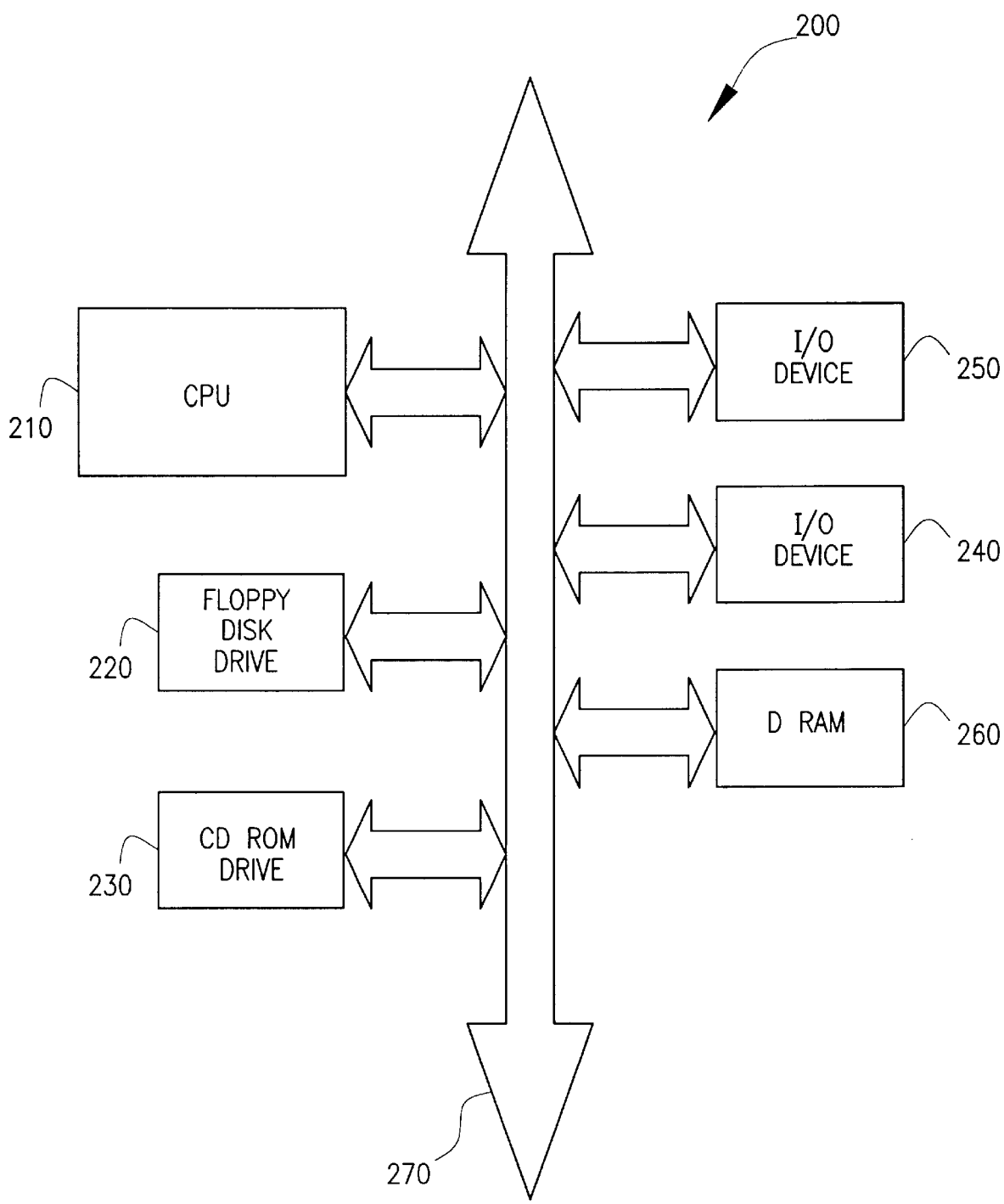
FIG. 5 is a block diagram of a processor system that includes a memory circuit having data masking according to the present invention.

A typical processor based system that includes memory circuits according to the present invention is illustrated generally at 200 in FIG. 5. A computer system is exemplary of a system having memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 210, for example, a microprocessor, that communicates with one or more input/output (I/O) devices 240, 250 over a bus 270. The computer system 200 also includes dynamic random access memory (DRAM) 260, and, in the case of a computer system may include peripheral devices such as a floppy disk drive 220 and a compact disk (CD) ROM drive 230 which also communicate with CPU 210 over the bus 270. Data masking by DRAM 260 is preferably performed according to the present invention as previously described with respect to FIGS. 3 and 4. CPU 210 and memory 260 may be integrated on a single chip.

While preferred embodiments of the invention have been described and illustrated above, it should be understood that these are exemplary of the invention and are not to be considered as limiting. For example, the principles of the present invention are also applicable to wider or narrower memory devices, such as a 16-bit wide memory device, which would have two independent column decoders and two data mask signal lines. Additions, deletions, substitutions, and other modifications can be made without detracting from the spirit or scope of the present inventor. Accordingly, the invention is not to be considered as limited by the foregoing description but is only limited by the scope of the appended claims.

What is claimed as new and desired to be protected by Letters Patent of the United States is:

1. A method of writing data to a memory device comprising the steps of:

receiving an address of said memory device into which said data is to be written;

decoding said address to determine a location of said memory device associated with said address;

receiving said data, wherein the data comprises a plurality of bytes received in synchronization with a synchronization edge of an external clock signal;

receiving a data mask signal for at least a portion of said data;

activating a column line for each location of said memory device associated with an address for said data for which a data mask signal is not received to write said data for which a data mask signal is not received into said memory device; and not activating a column line for each location of said memory device associated with an address for said at least a portion of said data for which said data mask signal is received to prevent said at least a portion of said data for which said data mask signal is received from being written to said memory device.

2. The method according to claim 1, wherein at least one of said decoded address, said data mask signal and said data is delayed by a predetermined time such that said decoded address, said data mask signal and said data arrive simultaneously.

3. The method of claim 1, wherein said step of not activating is done on a per-byte basis.

* * * * *